United States Patent [19]
Ide

[11] Patent Number: 5,994,715
[45] Date of Patent: *Nov. 30, 1999

[54] SEMICONDUCTOR DEVICE AND METHOD FOR DISCRIMINATING BAD SEMICONDUCTOR DEVICES FROM GOOD ONES

[75] Inventor: Kazunori Ide, Nagasaki, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/590,179

[22] Filed: Jan. 23, 1996

[30] Foreign Application Priority Data

Jan. 25, 1995 [JP] Japan .................................. 7-027754

[51] Int. Cl.[6] .......................... H01L 23/58; H01L 31/058; G01R 31/02; G01R 31/26
[52] U.S. Cl. ............................ 257/48; 257/467; 257/470; 324/763; 324/765
[58] Field of Search ..................................... 257/467, 470, 257/48; 324/763, 765

[56] References Cited

U.S. PATENT DOCUMENTS

| | | | |
|---|---|---|---|
| 4,788,151 | 11/1988 | Preziosi et al. .............................. | 436/2 |
| 4,924,112 | 5/1990 | Anderson et al. .......................... | 326/32 |
| 5,389,458 | 2/1995 | Weiss et al. ............................... | 429/90 |
| 5,391,892 | 2/1995 | Devereaux et al. ....................... | 257/48 |
| 5,440,520 | 8/1995 | Schutz et al. ............................. | 365/226 |
| 5,521,421 | 5/1996 | Furuhata .................................... | 257/467 |
| 5,543,632 | 8/1996 | Ashley ....................................... | 257/48 |
| 5,598,100 | 1/1997 | Maeda et al. ............................. | 324/501 |
| 5,673,028 | 9/1997 | Levy .......................................... | 340/635 |

FOREIGN PATENT DOCUMENTS 6-53292  2/1994  Japan .

*Primary Examiner*—Mahshid Saadat
*Assistant Examiner*—Allan R. Wilson
*Attorney, Agent, or Firm*—Hill & Simpson

[57] ABSTRACT

An integrated circuit testing device and method for verifying functionality of an integrated circuit semiconductor device employs an operation checking circuit at an input/output of an integrated circuit and a thermally sensitive resin layer applied on the operation checking circuit unit. A transistor is used as a heat generating element for identifying abnormalities determined during evaluation of the integrated circuits such that when an abnormality is detected, the transistor receives a large current flow causing heat to be dissipated which in turn causes a change in the color of the thermally sensitive resin.

14 Claims, 1 Drawing Sheet

SEMICONDUCTOR DEVICE AND METHOD FOR DISCRIMINATING BAD SEMICONDUCTOR DEVICES FROM GOOD ONES

BACKGROUND OF THE INVENTION

1. Field of the Invention

The present invention relates to a semiconductor device equipped with a function for inspecting the native semiconductor integrated-circuit unit and also relates to a method for discriminating bad semiconductor devices from good ones.

2. Description of Related Art

In the conventional step of inspecting semiconductor integrated circuits, which are referred to hereafter simply as ICs, the following methods are adopted for discriminating bad products from good ones in accordance with results produced by the step of examination.

According to a first method, a predetermined array of IC chips made on the surface of a semiconductor wafer are measured by means of a prober or the like. Then, the surfaces of bad IC chips are coated with ink or the like. In a later step, bad products are discriminated from good ones in accordance with whether or not ink exists on the surfaces of the IC chips.

According to a second method, a predetermined array of IC chips made on the surface of a semiconductor wafer are measured by means of a prober or the like. Then, information on each IC chip indicating whether the IC chip is good or bad is recorded in communication media such as a floppy or hard disk. In a later step, only good IC chips are extracted for assembly in accordance with the good/bad information.

An example of a third method is disclosed in Japanese Patent Laid-open No. Hei1-21936. According to the third method, a thermally sensitive resin layer is formed on the surface of the semiconductor wafer. Then, the color of the surface of an IC chip, which is determined to be bad with the state of the semiconductor wafer kept as it is, is changed by a special heat generating apparatus external to the wafer. In a later step, bad products are discriminated from good ones in accordance with whether or not the surfaces of the IC chips have changed.

In the case of the first method, however, an ink mark or the like may stick to an adjacent good IC chip. In this case, the good chip will be regarded as a bad one by mistake. In addition, in the case of a semiconductor device such as the charge coupled device (CCD) and a linear sensor, for example, infinitesimal ink dust may be scattered and sticks to the surface of an adjacent IC chip. The dust is then detected at a measurement after the assembly step in which case the assembled product is regarded as a bad one.

In the case of the second method, an error may be generated in the relation associating IC chips with the good/bad information stored in the communication media. In this case, the communication media contains a data error and, in an automatic or manual assembly step based on the good/bad information, it is thus feared that a bad device may be mixed with good ones in the assembled products.

In the case of the third method, the special heat generating apparatus for changing the color of the thermally sensitive resin layer is required and it costs money and labor to maintain and operate the special heat generating apparatus.

An example of a method for solving the problems described above is disclosed by the person submitting this patent application in Japanese Patent Laid-open No. Hei6-53292. According to this method, an operation checking circuit unit is provided on the input-output terminal unit of each IC chip. In the case of a bad IC chip, an excessively large voltage is applied to the operation checking circuit unit. The operation checking circuit unit is damaged by the voltage, changing the color of the surface of the IC chip. In a later step, bad products are discriminated from good ones in accordance with whether or not the surfaces of the IC chips have changed.

In the case of the method described above, however, in spite of the fact that the extremely large voltage is applied only to the operation checking circuit unit, thus, having no effect on the native semiconductor integrated-circuit unit, there is a problem that it takes time to destroy the operation checking circuit unit because elements such as transistors constituting the operation checking circuit unit need to be burned.

SUMMARY OF THE INVENTION

The present invention addresses this problem. It is an object of the present invention to provide a semiconductor device and a method for discriminating bad semiconductor devices from good ones at a high speed and with ease without affecting the product yield.

A semiconductor device provided by the present invention is equipped with: a semiconductor integrated-circuit unit having the native circuit functions; an operation checking circuit unit provided on an input-output terminal unit of the semiconductor integrated-circuit unit for checking operations of the semiconductor integrated-circuit unit; and a thermally sensitive layer formed on the circumference of the semiconductor integrated-circuit unit wherein the color of the layer changes by heat generated by the operation checking circuit unit.

The operation checking circuit unit can be designed into a configuration wherein a heat generating element is included individually for each input-output terminal of the input-output terminal unit of the semiconductor integrated-circuit unit and a region on the thermally sensitive layer corresponding to the heat generating element changes its color due to heat generated by the heat generating element.

The individually provided heat generating element can be designed into a configuration comprising a transistor.

The thermally sensitive layer can be placed as a top layer of the operation checking circuit unit.

A method provided by the present invention for discriminating bad semiconductor devices from good ones in a manufacturing step in semiconductor device units each made to comprise: a semiconductor integrated-circuit unit having the native circuit functions; an operation checking circuit unit provided on an input-output terminal unit of the semiconductor integrated-circuit unit for checking operations of the semiconductor integrated-circuit unit; and a thermally sensitive layer formed on the circumference of semiconductor integrated-circuit unit, and the method comprises the steps of: checking operations of the semiconductor integrated-circuit unit; letting the operation checking circuit unit generate heat in accordance with a result output by the step of checking operations of the semiconductor integrated-circuit unit and letting the generated heat change the color of the thermally sensitive layer; and discriminating a bad product from a good one in accordance with whether or not the color of the thermally sensitive layer has changed.

In the method for discriminating bad semiconductor devices from good ones, the operation checking circuit unit can be designed into a configuration wherein a heat generating element is included individually for each input-output terminal of the input-output terminal unit of the semiconductor integrated-circuit unit and a region on the thermally sensitive layer corresponding to the heat generating element changes its color due to heat generated by the heat generating element.

In the method for discriminating bad semiconductor devices from good ones, the individually provided heat generating element is simply devised to generate heat in a specific pattern selected in accordance with the type of failure and a region of the specific pattern having a changed color is formed on the thermally sensitive layer.

In the method for discriminating bad semiconductor devices from good ones, the steps are implemented for each semiconductor device with a predetermined array of semiconductor device units made on a semiconductor wafer, or for each semiconductor device with the semiconductor device unit cut off from the semiconductor wafer.

In the semiconductor device or the method for discriminating bad semiconductor devices from good ones provided by the present invention, a thermally sensitive layer is formed on the circumference of the semiconductor integrated-circuit unit wherein the color of the layer changes by heat generated by the operation checking circuit unit. As a result, the layer can changes its color sensitively even by a small amount of generated heat.

In particular, in the semiconductor device wherein the operation checking circuit unit includes an individual heat generating element for each input-output terminal of the input-output terminal unit of the semiconductor integrated-circuit unit and a region on the thermally sensitive layer corresponding to the heat generating element changes its color due to heat generated by the heat generating element or in the method for discriminating bad semiconductor devices from good ones utilizing the semiconductor device, a region on the thermally sensitive layer corresponding to the heat generating element provided individually for each input-output terminal of the input-output terminal unit of the semiconductor integrated-circuit unit changes its color in accordance with heat generated by the heat generating element. As a result, the input-output terminal connected to the heat generating element that is radiating heat can be identified from the position of the region with a changed color, allowing an abnormal internal circuit to be identified.

In the method for discriminating bad semiconductor devices from good ones utilizing a semiconductor device wherein the individually provided heat generating element generates heat in a specific pattern selected in accordance with the type of failure and a region of the specific pattern having a changed color is formed on the thermally sensitive layer. As a result, the type of failure can be recognized with ease.

As described above, according to the method for discriminating bad semiconductor devices from good ones provided by the present invention, a thermally sensitive layer changes its color due to heat dissipated by an operation checking circuit unit. Accordingly, it is possible to change the color sensitively by the generated heat. As a result, the color can be changed by flowing a small amount of current through the transistor and it takes only a short time to change the color in comparison with the conventional method whereby the transistor itself is destroyed in order to change the color of the surface of the semiconductor. On the top of that, ink is not used, eliminating the problems such as scattered ink. In addition, since no external special heat generating apparatus is required, its maintenance and operation costs are eliminated. Furthermore, when the method for automatically discriminating bad semiconductor devices from good ones is adopted at in conjunction with bad/good data recorded in communication media used as a base, for example, a bad product can be recognized at a glance by visualizing the external appearance of the actual IC chip, allowing incorrect discrimination to be prevented even if a bad product is mixed with good ones due to an error existing in the bad/good data.

In addition, the color of a region on the thermally sensitive layer corresponding to a heat generating element is changed by heat dissipated by the heat generating element individually provided for each terminal of the input-output terminal unit of the semiconductor integrated circuit. As a result, the input-output terminal connected to the heat generating element that is radiating heat can be identified from the position of the region with a changed color, allowing a portion with an abnormal internal circuit to be identified directly and easily by visualizing the external appearance of the IC chip.

The individually provided heat generating element is devised to generate heat in a specific pattern selected in accordance with the type of failure and a region of the specific pattern having a changed color is formed on the thermally sensitive layer. As a result, the type of failure can be recognized from this pattern. That is to say, the type of failure can be recognized with ease by visualizing the external appearance of the IC chip.

On the top of that, the steps for discriminating bad semiconductor devices from good ones are carried out for each of semiconductor devices on the semiconductor wafer as they are, allowing the discrimination of bad devices from good ones to be performed with a high degree of efficiency.

DESCRIPTION OF THE PREFERRED EMBODIMENTS

The present invention will become apparent from the following detailed description of preferred embodiments with reference to accompanying diagrams.

Figure 1:
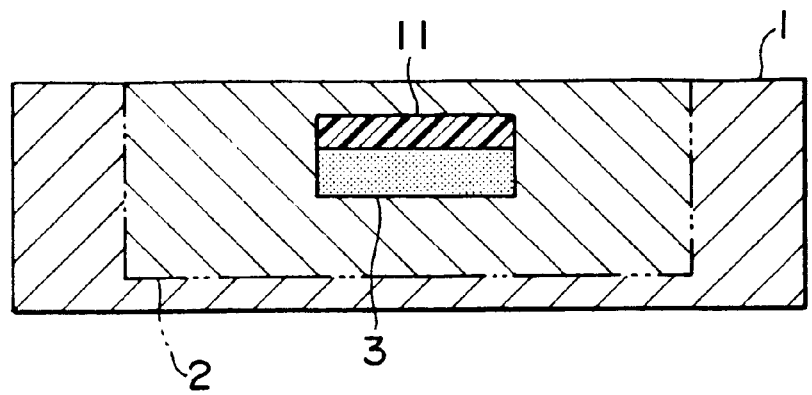
FIG. 1 is a cross-sectional diagram showing a conceptual cross-sectional configuration of an embodiment implementing a semiconductor device in accordance with the present invention.
Figure 2:
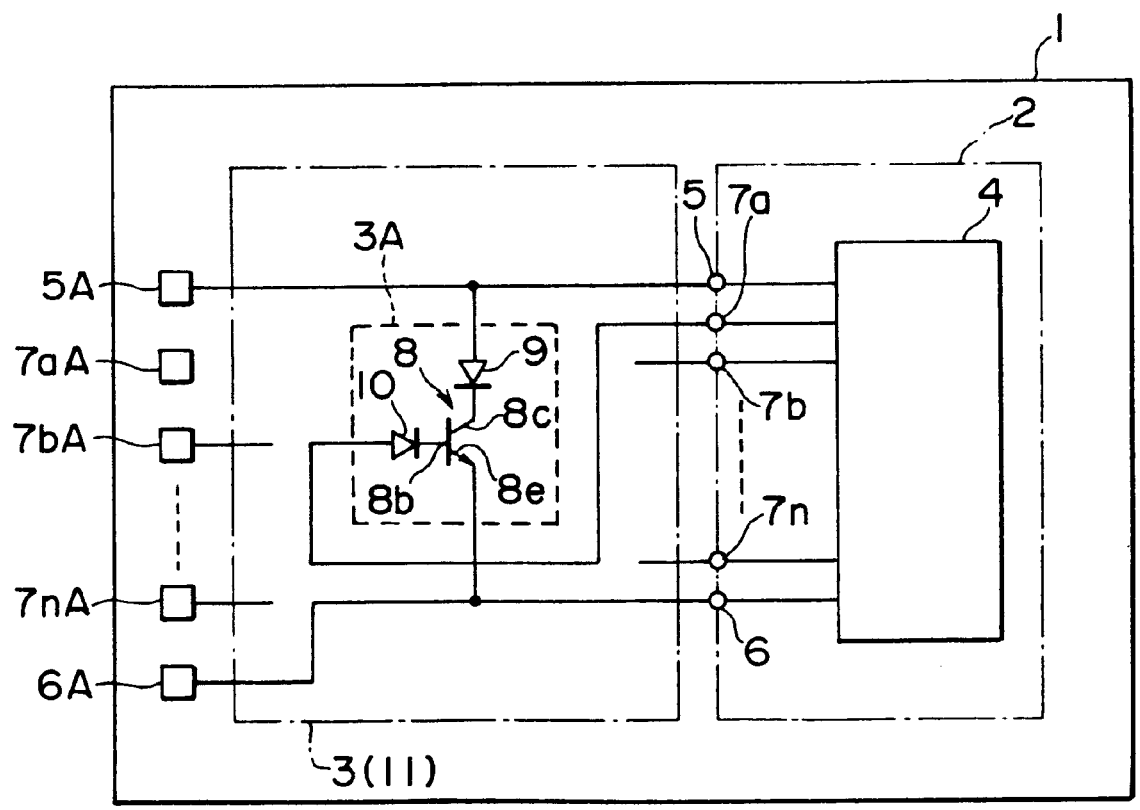
FIG. 2 is a circuit block diagram showing a conceptual plane configuration of the semiconductor device shown in FIG. 1.

FIG. 1 is a conceptual cross-sectional diagram of an embodiment implementing a semiconductor device in accordance with the present invention. FIG. 2 is a conceptual plane diagram of the semiconductor device. As shown in the figures, an IC unit 2 including an IC 4, the conventional semiconductor integrated circuits, and an operation checking circuit unit 3 for checking operations of the IC unit 2 are made on the semiconductor device 1. A thermally sensitive resin layer 11, which changes its color by heat applied thereto, is formed as a top layer of the operation checking circuit unit 3. It should be noted that the semiconductor device 1 is cut off from a semiconductor wafer, not shown in the figures, on which wafer a plurality of semiconductor devices are made to form a predetermined array. In other words, the semiconductor device 1 is one of those made on the wafer.

As shown in FIG. 2, the IC 4 is equipped with a common power supply terminal 5, a common ground terminal 6 and a plurality of signal input-output terminals 7a to 7n. It should be noted, however, that the figure shows these terminals in a way that makes the explanation easy to understand. In actuality, these terminals do not appear on the surface of the semiconductor device 1. An operation checking circuit 3A comprising an NPN transistor 8 and diodes 9 and 10 is connected between the power supply and ground terminals 5 and 6, forming a parallel circuit in conjunction with the IC 4. To put it in concrete terms, the collector 8c of the NPN transistor 8 is connected to the power supply terminal 5 through the diode 9 whereas the emitter 8e thereof is connected to the ground terminal 6. The base 8b of the NPN transistor 8 is connected to the signal input-output terminal 7a through the diode 10. The diode 9 is connected with an reversed polarity with respect to the power supply terminal 5 while the diode 10 is connected with a forward polarity with respect to the base 8b of the NPN transistor 8. In addition, the common power supply terminal 5, the common ground terminal 6 and the signal input-output terminals 7a to 7n are connected to a power supply electrode 5A, a ground electrode 6A and a plurality of signal input-output electrodes 7aA to 7nA respectively. These electrodes are made in such a way that they protrude out off the surface of the semiconductor device 1.

The operation checking circuit 3A is provided for the signal input-output terminal 7a. An operation checking circuit having the same configuration as the operation checking circuit 3A is provided for each of the other signal input-output terminals 7b to 7n. The other operation checking circuits are connected to the power supply terminal 5 and the ground terminal 6 in the same way as the operation checking circuit 3A. All the operation checking circuits provided for the signal input-output terminals 7a to 7n compose the operation checking circuit unit 3.

Next, a technique for inspecting the semiconductor device having the configuration described above is explained. First of all, based on a predetermined inspection program, a prober of an inspection apparatus not shown in the figure is brought to a location in close proximity to one of the semiconductor devices 1 made on a semiconductor wafer and a direct current voltage of typically 5V is applied to the power supply electrode 5A of this semiconductor device 1. The ground electrode 6A is put at 0V and the IC 4 of the IC unit 2 is operated. A test signal is then applied to the signal input-output electrode 7aA. These operations are carried out for all other signal input-output electrodes 7bA to 7nA of the semiconductor device 1.

If a portion of the internal circuit of the IC 4 associated with a certain signal input-output terminal does not work normally, an excessively large voltage, typically a direct current voltage of 20V, is applied to the power supply electrode 5A, with the test signal being applied to the signal input-output electrode 7aA, in order to open the transistor 8 thereof. A relatively large current thereby flows through the transistor 8, causing heat to be dissipated. As a result, the color of a region corresponding to the transistor 8 on the thermally sensitive resin layer 11, the top layer of the semiconductor device 1, changes. Such operation checking work is carried out for all semiconductor devices 1 which are made on the semiconductor wafer. If the IC 4 operates normally for all the signal input-output electrodes 7aA to 7nA, the operation checking circuit 3A can be left as it is. This is because each operation checking circuit 3A is connected to the signal input-output terminals 7a to 7n of the IC 4 with a reversed polarity so that there is no bad effect on the IC 4 even if the operation checking circuit 3A is left as it is.

After such inspection work has been done for all semiconductor devices 1 made on the semiconductor wafer, the color of regions on the thermally sensitive resin layer 11 corresponding to the transistors 8 of bad semiconductor conductor devices 1 changes due to heat dissipated by the transistors 8. The change in color can be recognized by directly visualizing the surface of the semiconductor devices 1 or by detection by means of an optical means. In this way, it is possible to cut off only good semiconductor devices 1 from the semiconductor wafer before being conveyed to the next assembly step.

As described above, in this embodiment, the color of the thermally sensitive resin layer 11 formed as a top layer of the operation checking circuit unit 3 changes due to heat dissipated by the transistor 8. Accordingly, the layer can changes its color sensitively even by a small amount of generated heat. As a result, the color can be changed by flowing a small amount of current through the transistor and it takes only a short time to change the color in comparison with the conventional method whereby the transistor itself is destroyed in order to change the color of the surface of the semiconductor.

It should be noted that, in the case of this embodiment, when an abnormal operation is detected, only the transistor 8 of the operation checking circuit 3A associated with a signal input-output terminal for which the abnormality is detected is opened to dissipate heat for changing the color of the thermally sensitive resin layer 11. In this way, by analyzing locations of the semiconductor device 1 with the color thereof changed later on, it is possible to determine with ease which internal circuit of the IC 4 associated with the signal input-output terminal has an abnormal operation. Accordingly, by statistically carrying out this inspection for bad semiconductor devices, it is also possible to identify with ease which manufacturing step has a problem.

In addition, once a bad semiconductor device has been identified, the transistor 8 of the operation checking circuit 3A can be devised to generate heat of a predetermined pattern (or combination) selected for each of the signal input-output terminals 7a to 7n, allowing the failure mode (or the type of failure) to be displayed on the surface of the semiconductor device 1. For example, let three of the signal input-output terminals 7a to 7n be chosen as specific terminals for displaying a failure mode. By letting the transistor 8 connected to these specific terminals generate heat on a selection basis, it is possible to display eight (the second power of two) different failure modes.

In addition, the region on the thermally sensitive resin layer 11, which region changes its color due to heat dissipated by the transistor 8, is dependent on the direct current voltage applied to the power supply electrode 5A and the application duration. Accordingly, by appropriately setting the magnitude of the voltage and the duration as parameters, it is possible to create a changed color spot with any arbitrary size.

In addition, in the case of this embodiment, a NPN transistor is used as a means for changing the color of the thermally sensitive resin layer 11. It should be noted, however, that a PNP transistor can also be used as well. As a matter of fact, any other device can be used as long as the device can generate heat when an excessively large voltage is applied thereto.

What is claimed is:

1. A semiconductor device, comprising:

a semiconductor integrated-circuit unit having a primary circuit;

an operation checking circuit unit attached to an input-output of said primary circuit, said operation checking circuit unit being formed of semiconductor material and being on a common substrate with said semiconductor integrated-circuit unit; and a thermally sensitive layer on the operation checking circuit unit wherein the color of said thermally sensitive layer is changed by heat generated by said operation checking circuit unit, wherein said thermally sensitive layer is placed as a top layer of said operation checking circuit unit.

2. A semiconductor device according to claim 1, wherein said operation checking circuit unit includes a heat generating element and a corresponding region on said thermally sensitive layer changes its color due to heat generated by said heat generating element.

3. A semiconductor device according to claim 2 wherein said heat generating element is a transistor.

4. A semiconductor device, comprising:

a semiconductor wafer including a plurality of integrated circuit units formed on regions of the wafer;

at least one of said semiconductor integrated-circuit units having a primary circuit;

an operation checking circuit unit formed in said semiconductor wafer and being connected to a signal line of said primary circuit, said operation checking circuit including a plurality of heat generating elements formed as circuit elements in said semiconductor wafer, said heat generating elements being formed to generate a predetermined level of heat upon a predetermined signal level being exceeded in said signal line of said primary circuit; and a thermally sensitive layer on a top surface of the operation checking circuit unit so at to provide a visual indication of said predetermined level of heat being reached by said heat generating elements.

5. The semiconductor device of claim 4, further comprising a plurality of operation checking circuits attached to a corresponding plurality of signal lines.

6. The semiconductor device of claim 5, wherein each signal line of said native circuit has a corresponding operation checking circuit unit.

7. The semiconductor device of claim 4, wherein the thermally sensitive layer is formed primarily over only the operation checking circuit unit.

8. The semiconductor device of claim 4, wherein the thermally sensitive layer is formed exclusively over the operation checking circuit unit.

9. The semiconductor device of claim 5, wherein the thermally sensitive layer is formed primarily over only the operation checking circuit units.

10. The semiconductor device of claim 5, wherein the thermally sensitive layer is formed exclusively over the operation checking circuit units.

11. The semiconductor device of claim 1, wherein the operation checking circuit comprises means for identifying at least one specific abnormal internal circuit of the semiconductor device.

12. The semiconductor device of claim 1, wherein the operation checking circuit and the thermally sensitive layer include means for identifying a plurality of separate failure modes.

13. The semiconductor device of claim 4, wherein the operation checking circuit comprises means for identifying at least one specific abnormal internal circuit of the semiconductor device.

14. The semiconductor device of claim 4, wherein the operation checking circuit and the thermally sensitive layer include means for identifying a plurality of separate failure modes.

* * * * *